CIRCUIT FOR PREVENTING RINGING IN A PULSED NETWORK

Filed June 29, 1961

INVENTOR.
RALPH MEKEL
BY
Charles R. Lepchinsky
AGENT

United States Patent Office 3,152,265

Patented Oct. 6, 1964

3,152,265

CIRCUIT FOR PREVENTING RINGING IN A PULSED NETWORK

Ralph Mekel, Yeadon, Pa., assignor to Burroughs Corporation, Detroit, Mich., a corporation of Michigan Filed June 29, 1961, Ser. No. 120,562
9 Claims. (Cl. 307—88.5)

This invention relates to the prevention of oscillations and more particularly to the prevention of oscillations in a transistor emitter follower circuit.

For certain application of transistor logic circuits it is desirable that the logic circuits be capable of very rapid switching. High speed switching can be obtained by utilizing transistor emitter followers as non-switching elements in class A operation. The emitter follower may be used in a basic logic circuit along with other logical elements such as diodes to form a high-speed switching arrangement known as Hybrid Transistor Diode Logic (HTDL). However, under certain conditions, a signal containing a D.C. level applied to an emitter follower causes the emitter follower to oscillate, thereby alleviating its usefulness as a logical element.

Accordingly, an object of this invention is the prevention of oscillations in an emitter follower circuit.

Another object of this invention is the prevention of oscillations in an emitter follower circuit without affecting the response of the emitter follower.

A further object of this invention is enabling the emitter follower to act as an emitter follower only during the presence of an input pulse and at all other times have the emitter load effectively disconnected from the circuit even though the emitter follower is biased in class A operation.

A still further object of this invention is the improvement of transistor circuits.

The present invention prevents oscillations in an emitter follower by inserting a small uniform impedance in series with and between the emitter and its load impedance. This small uniform impedance shifts the level of the output signal slightly. This shift in level of the output voltage is utilized to forwardly bias a unidirectional current device connected to the output whenever an input signal containing a D.C. level is applied to the emitter follower. Conduction of the unidirectional current device effectively removes the load from the emitter follower and clamps the emitter voltage, thereby preventing any oscillations.

A more detailed description follows in conjunction with the following drawings in which.

Figure 1:
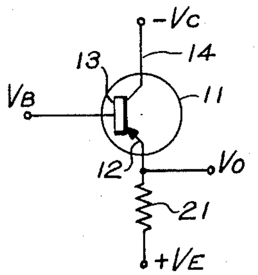
FIGURE 1 is a schematic diagram of the basic emitter follower circuit which is well known in the art.

Referring now to the drawings wherein like reference characters designate like or corresponding parts throughout the several figures, there is shown in FIGURE 1 an emitter follower circuit comprising a PNP transistor 11 having an emitter 12, a base 13, and a collector 14 electrode. The collector 14 is returned directly to a source of negative potential $V_C$, the base 13 is connected to a source of biasing potential $V_B$, and the emitter 12 is connected to a source of positive potential $V_E$ through load resistor 21. The input signal is applied to the base 13. The output signal $V_0$ is obtained from the emitter 12 electrode.

The emitter follower shown in FIGURE 1 receives its name from its vacuum-tube counterpart, the cathode follower. The emitter follower provides power gain and has no phase inversion. In addition, it affects only a slight attenuation of the input signal as well as a slight change in the D.C. level signal from input to output.

For high speed operation of the emitter follower the minority carrier storage of the transistor 11 must be reduced to a minimum. This is accomplished by making the collector voltage supply $V_C$ approximately —1 to —1.5 volts more negative than the most negative excursion of the input signal. If the PNP transistor is replaced with a NPN transistor, all the voltages would need to be reversed and $V_C$ would be +1 to +1.5 volts more positive than the most positive excursion of the input signal to minimize minority carrier storage. This magnitude of collector supply voltage $V_C$ will enable the transistor 11 to remain in the active region when an input signal is applied to the base 13 (class A operation), thus preventing the collector 14 from becoming biased in the forward direction. This reverse bias on the collector 14 will also tend to reduce the collector capacitance because the collector capacitance is inversely proportional to the collector voltage.

The feedback in the emitted follower circuit shown in FIGURE 1 is normally of a degenerative nature. If the base 13 current changes by a given amount, the change in emitter 12 current is proportional and produces a feedback voltage on the emitter 12. Because the emitter voltage follows the base voltage, the feedback voltage on the emitter produces a feedback current in the base in the opposite direction to that of the signal current in the base and thus represents negative feedback.

Figures 2, 4:
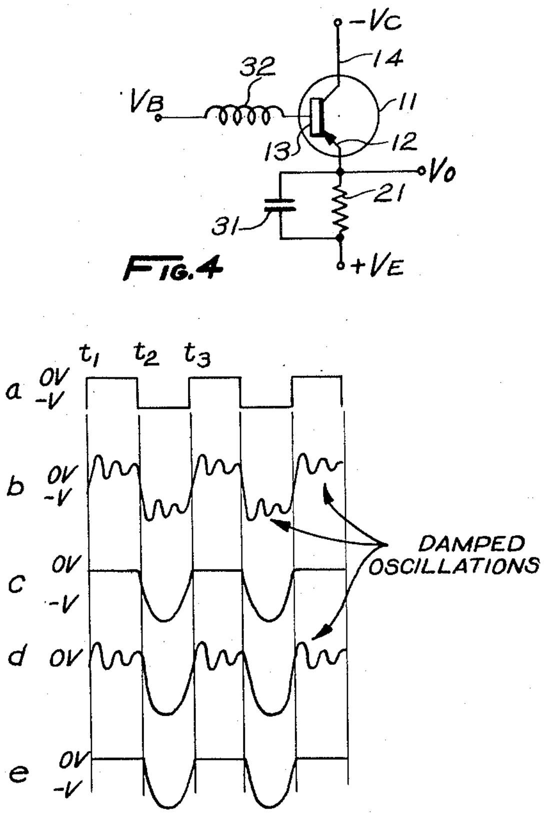
FIGURE 2 is a schematic diagram of the same basic emitter follower shown in FIGURE 1 but, in addition, shows actual and stray reaction components added to the circuit.
FIGURE 4 shows ideal input and output waveshapes for the circuits shown by FIGURES 1, 2, and 3.

In the emitter follower circuit, and especially in a chain of emitter follower circuits, it can be considered that there is an inductance 32 in series with the base element 13 and a capacitance 31 shunted across the emitter follower resistance 21, as shown in FIGURE 2. The inductance 32 is present because of any inductive effect in the lead wires and any actual inductance used in the circuit. The capacitance 31 effect is due to the stray capacitance in the circuit plus any physical capacitance actually in the circuit.

Because of the inductance 32 and capacitance 31, the normally degenerative feedback can become regenerative and cause the circuit to oscillate. The change from degenerative to regenerative feedback can be understood from phase shift considerations. If the input signal applied to the base 13 of transistor 11 is sinusoidal, the emitter 12 current will lag the base current by an amount $\phi_1$ because of transistor delay. The resistor-capacitor network 21, 31 in the emitter circuit will cause the feedback voltage on the emitter 12 to lag the emitter current by an amount $\phi_2$, and there will be another phase lag $\phi_3$ between the feedback current in the base 13 and the feedback voltage on the emitter 12 because of the inductance 32 in the base circuit. The resulting feedback current will then be $-(180+\phi_1+\phi_2+\phi_3)$ degrees out of phase with the input signal base current. For certain frequencies the sum of $\phi_1+\phi_2+\phi_3$ will be 180 degrees causing the feedback current to be in phase with the input signal base current thereby giving the emitter follower a tendency to oscillate.

FIGURE 4*a* shows an input signal comprising a series of negative going square waves. Investigations have shown that when an input signal such as that shown in FIGURE 4*a* is applied to the base off the transistor 11 shown in FIGURE 1, the ouput $V_0$ signal of the circuit oscillates at the negative and positive D.C. levels as is shown by FIGURE 4*b*. These oscillations are caused by the actual and stray reactive components in the circuit discussed above and shown by FIGURE 2.

When negative going input pulses not having a negative D.C. level, as shown by FIGURE 4*c*, are applied to the 13 of the transistor 11 shown in FIGURE 1, the output signal $V_0$ of the circuit oscillates only at the positive D.C. level, as is shown by FIGURE 4*d*. Investigations have also shown that when a plurality of emitter followers are cascaded, the gain becomes greater than unity causing the oscillations to be amplified which aggravates the problem.

Figure 3:
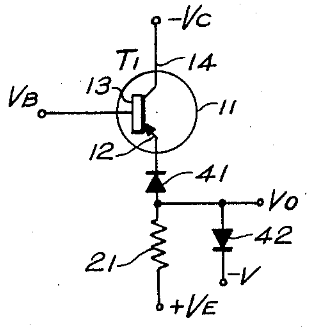
FIGURE 3 is a schematic diagram of an emitter follower containing a preferred embodiment of the present invention.

FIGURE 3 shows an emitter follower containing a preferred embodiment of the present invention which prevents the oscillations at the positive D.C. level of the output signal. Consider now the circuit shown in FIGURE 3 when the signal shown by FIGURE 4*c* is applied to the base 13. During the time $t_1$ to $t_2$, the base of the transistor 11 will be at ground potential. Since the emitter 12 is returned to a source of positive potential $V_E$, the base potential is negative with respect to the emitter which forwardly biases the transistor 11 causing it to conduct.

Figure 5:
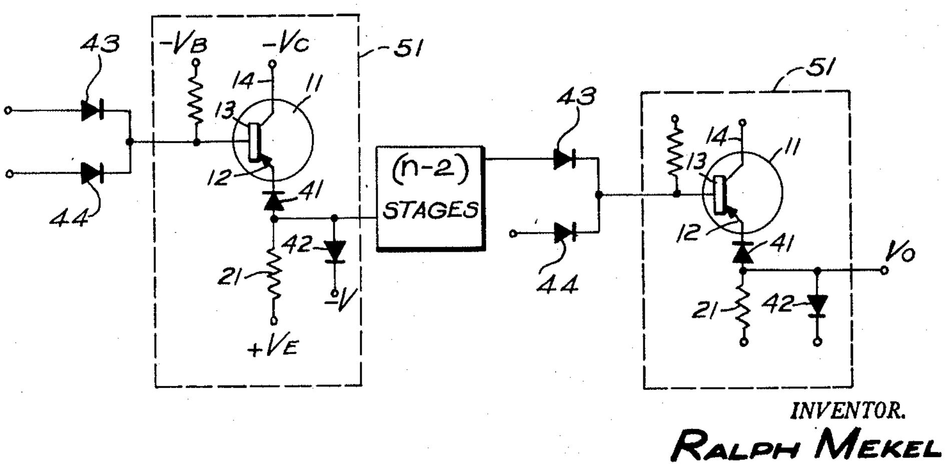
FIGURE 5 is a schematic diagram of a chain of emitter followers each containing a preferred embodiment of the present invention and incorporated in a basic logic circuit together with a logical arrangement of diodes to form a high speed switching arrangement.

The FIGURE 5 embodiment of several stages illustrates a negative voltage $V_B$ applied through a resistor to the base of each transistor to insure conduction of the transistor when input signals are at a zero volt level. The diode 41 in series with the emitter resistor 21 causes a positive level shift in the output signal due to the slight voltage drop across the diode 41. That is, the emitter 12 potential follows the input potential seen on the base 13 which is at ground potential and therefore the emitter 12 potential is also substantially at ground. Because the output signal $V_0$ is taken between the diode 41 and the emitter resistor 21, the output level is slightly positive with respect to the emitter potential by an amount equal to the voltage drop across the diode 41 plus the very small emitter to base diode drop.

This positive shift in voltage level due to diode 41 forwardly biases diode 42, which has its anode terminal connected to the output potential $V_0$ and its cathode terminal connected to a source of negative potential V, causing it to conduct. The source V must be more negative than the output potential $V_0$ by at least the drop across diode 42. The conduction of diode 42 standardizes the output potential $V_0$ level by clamping the output potential to a value equal to the sum of the potential V to which the cathode of diode 42 is connected and the voltage drop across diode 42. The clamping action of diode 42 damps out any oscillations that tend to occur due to stray and actual reactive components being in the circuit and the output signal with the diodes 41 and 42 in the circuit is shown by FIGURE 4*e*.

The clamping action of diode 42 also effectively disconnects the emitter load thus eliminating the emitter follower characteristics during the time $t_1$ to $t_2$ because the clamping action of diode 42 keeps the emitter current constant resulting in no variation in the ratio of emitter current to base current.

During the time $t_2$ to $t_3$, the input signal goes negative but the negative input signal contains no D.C. level and therefore no oscillations occur in the output $V_0$ signal. When the base of the transistor 11 goes negative, the forward bias of the transistor 11 is increased causing the transistor to conduct more heavily. This increase in current causes the output potential to go negative, as is shown in FIGURE 4*e* at time $t_2$ to $t_3$, which back biases the diode 42 causing it to be nonconducting. Because the diode 42 is cut off, the circuit operates as an emitter follower during time $t_2$ to $t_3$. As mentioned previously, by making the collector $V_C$ potential slightly more negative than the most negative excursion of the input signal, the transistor 11 always operates class A and minority carrier delay is minimized.

It is clear that the transistor acts as an emitter follower only during the presence of a negative pulse and at all other times the emitter load is effectively disconnected from the circuit due to the diodes 41 and 42.

If it is desirable to use positive input pulses in place of negative input pulses, it is only necessary to replace the PNP transistor 11 with a NPN transistor, reverse the diodes 41 and 42, and reverse the polarity of all of the potential sources.

The diode 41 functions to produce a shift in voltage that is applied to the diode 42. The impedance of the diode 41 is very small when it is conducting and the diode 41 may be replaced by a small uniform impedance element such as a high quality resistor of small ohmic value.

FIGURE 5 shows a chain of emitter follower circuits each incorporating a preferred embodiment of the present invention and incorporated in a basic logic circuit together with an arrangement of diodes to form a high speed switching arrangement. The diodes 43 and 44 permit operation from a plurality of inputs. It is obvious that emitter followers incorporating the present invention could be used in many other logical arrangements other than that shown in FIGURE 5.

I claim:

1. An electrical circuit for providing voltage pulses having a predetermined maximum amplitude comprising: a semiconductor device having at least an emitter electrode, a load impedance, voltage level shifting means connected between said emitter electrode and one end of said load impedance, said load impedance being adapted to have an emitter supply voltage coupled to its other end, output means coupled to the junction of said level shifting means and said load impedance, a unidirectional means also coupled to the junction of said level shifting means and said load impedance for electrically connecting said junction to a source of electrical potential which is equal to said predetermined maximum amplitude of said voltage pulses whenever a voltage drop across said voltage level shifting means causes the voltage at said junction to tend to become greater than said predetermined maximum amplitude.

2. The combination defined in claim 1 wherein said voltage level shifting means is a unidirectional current device.

3. The combination defined in claim 2 wherein said unidirectional means coupled to said junction is a diode.

4. In an emitter follower circuit of the class wherein the emitter electrode of a transistor is returned to a source of potential through a load impedance, the collector electrode is adapted to be connected to a potential source, and the base electrode is adapted to be connected to a source of input signals, an oscillation reducing network comprising: voltage level shifting means connected in series with, and between, said emitter electrode and said load impedance, output means connected to the junction of said voltage level shifting means and said load impedance, and means also connected to the junction of said voltage level shifting means and said load impedance for clamping the level of the output potential to a predetermined level in response to a D.C. level appearing in said input signal thereby damping out any oscillations that may tend to occur.

5. The combination defined in claim 4 wherein said voltage level shifting means is an impedance element.

6. The combination defined in claim 4 wherein said voltage level shifting means is a diode.

7. The combination defined in claim 4 wherein the means for clamping the level of the output potential is a unidirectional current device.

8. An emitter follower circuit comprising: a transistor having an emitter, a base and a collector electrode, first and second diodes each having an anode and a cathode, a first source of potential coupled to said collector electrode, a source of signals applied to said base electrode, said cathode of said first diode coupled to said emitter electrode, a second source of potential, a load impedance connected between said second source of potential and said anode of said first diode, output means connected to the junction of said first diode with said load impedance, said anode of said second diode coupled to said output means, a third source of potential having a polarity opposite to the polarity of said second source of potential coupled to said cathode of said second diode, said second diode adapted to conduct whenever a D.C. level appears in said source of signals causing said load impedance to be effectively disconnected from said emitter follower circuit thereby damping out any oscillations that may tend to occur.

9. A circuit for reducing oscillations in an emitter follower comprising: a transistor having an emitter, base and collector electrode, an emitter supply connected to said emitter electrode through an emitter resistor and a level shifting impedance, input circuit means enabling said transistor to conduct in the absence of an input signal, input means providing unidirectional signals about a fixed voltage reference level, output terminal means connected to the junction between said level shifting impedance and said emitter resistor, a diode having one end connected to said output terminal means and another end connected to a clamping source of supply voltage, the voltage developed across said level shifting impedance being sufficient to cause said diode to conduct clamping said output and eliminating oscillations when said input signal is at said fixed voltage reference level.

References Cited in the file of this patent

UNITED STATES PATENTS

| | | |
|---|---|---|
| 3,007,059 | Skerritt | Oct. 31, 1961 |
| 3,048,715 | Horton | Aug. 7, 1962 |